(12) United States Patent
Yokoyama et al.

(10) Patent No.: US 11,589,468 B2
(45) Date of Patent: Feb. 21, 2023

(54) LIQUID DISCHARGE STRUCTURE

(71) Applicant: Yazaki Corporation, Tokyo (JP)

(72) Inventors: Satoshi Yokoyama, Toyota (JP);
Yusuke Nagai, Toyota (JP); Makoto Goto, Toyota (JP)

(73) Assignee: YAZAKI CORPORATION, Tokyo (JP)

( * ) Notice: Subject to any disclaimer, the term of this patent is extended or adjusted under 35 U.S.C. 154(b) by 238 days.

(21) Appl. No.: 17/089,935

(22) Filed: Nov. 5, 2020

(65) Prior Publication Data
US 2021/0153370 A1 May 20, 2021

(30) Foreign Application Priority Data

Nov. 18, 2019 (JP) .............................. JP2019-207701

(51) Int. Cl.
*H05K 5/02* (2006.01)
*B60R 16/023* (2006.01)

(52) U.S. Cl.
CPC ....... *H05K 5/0217* (2013.01); *B60R 16/0239* (2013.01)

(58) Field of Classification Search
CPC .................................................. H05K 5/0213
See application file for complete search history.

(56) References Cited

U.S. PATENT DOCUMENTS

| 5,649,859 A * | 7/1997 | Shiga | H02G 3/088 |
| | | | 454/275 |
| 2003/0220067 A1* | 11/2003 | Mashiko | F21S 45/30 |
| | | | 454/254 |
| 2007/0109730 A1* | 5/2007 | Shigyo | H05K 5/068 |
| | | | 361/600 |
| 2008/0074840 A1* | 3/2008 | Suzuki | H05K 5/0213 |
| | | | 361/679.46 |
| 2010/0230128 A1* | 9/2010 | Aburaya | H05K 5/0213 |
| | | | 174/50 |
| 2013/0012117 A1* | 1/2013 | Uemura | B29C 66/5412 |
| | | | 454/275 |

(Continued)

FOREIGN PATENT DOCUMENTS

| CN | 105686569 A | 6/2016 |
| EP | 2144344 A1 | 1/2010 |

(Continued)

*Primary Examiner* — Hung V Ngo
(74) *Attorney, Agent, or Firm* — Sughrue Mion, PLLC

(57) ABSTRACT

An objective of the present invention is to improve the discharge capacity for liquid collected within a casing while suppressing liquid entering a discharge opening from the outside. A liquid discharge structure includes a plate-shaped bottom wall with a discharge opening for liquid, the liquid being collected inside a casing 1 which is configured to be installed in a vehicle, a blocking wall outside the bottom wall, wherein the blocking wall is overlapped with the discharge opening in a plan view on the bottom wall and opposed to the bottom wall with a gap between the blocking wall and the bottom wall, and a fixing mechanism which is disposed not to be overlapped with the discharge opening in the plan view, wherein the fixing mechanism is configured to fix the blocking wall relative to the bottom wall in an attachable and detachable manner.

11 Claims, 9 Drawing Sheets

(56) References Cited

U.S. PATENT DOCUMENTS

| | | | |
|---|---|---|---|
| 2013/0055898 A1* | 3/2013 | Yano | F21S 45/30 |
| | | | 96/4 |
| 2017/0156228 A1* | 6/2017 | Uemura | H05K 5/0213 |
| 2017/0235344 A1* | 8/2017 | Briquet | B60R 16/0231 |
| | | | 361/679.46 |
| 2019/0166706 A1* | 5/2019 | Trotman | H05K 5/0213 |

FOREIGN PATENT DOCUMENTS

| | | |
|---|---|---|
| JP | 05-78124 U | 10/1993 |
| JP | 9-103017 A | 4/1997 |
| JP | 2001-95129 A | 4/2001 |
| JP | 2008-87746 A | 4/2008 |
| JP | 2019-155046 A | 9/2019 |

* cited by examiner

LIQUID DISCHARGE STRUCTURE

BACKGROUND OF THE INVENTION

Technical Field

The present invention relates to a liquid discharge structure which is configured to discharge liquid collected inside a casing installed in a vehicle.

Background Art

Conventionally, e.g. an electrical junction box, such as a relay box, and/or a protector for wire harness protection are installed in a vehicle. In this case, some of such components are intended to be disposed in a lower portion of the vehicle, wherein liquid, such as rain water from the outside of the vehicle and/or washing water, may enter such components in the lower portion. Therefore, a liquid discharge structure is oft provided in a casing, e.g. for an electrical junction box and/or a protector, wherein the liquid discharge structure is configured to discharge liquid collected inside the casing.

Such a liquid discharge structure itself which is provided in the casing may form an access passage for the liquid from the outside. Therefore, a liquid discharge structure is proposed which discharges liquid collected inside the casing and further suppresses liquid being introduced from the outside (e.g. see Patent Document 1). The liquid discharge structure according to this Patent Document 1 has a structure with a discharge opening in a bottom wall of the casing, wherein the discharge opening is configured so that a clamp can be attached to the discharge opening, the clamp including a plate portion for blocking liquid and an engaging protrusion. With this liquid discharge structure, the plate portion of the clamp can suppress liquid being introduced from the outside.

CITATION LIST

Patent Literature

Patent Document 1: JP 2001-095129 A

SUMMARY OF THE INVENTION

However, the liquid discharge structure as described above may narrow the discharge path for liquid inside the casing by the engaging protrusion which enters the discharge opening and is locked therein. Therefore, there is room for further improvement with regard to the discharge capacity.

Therefore, the present invention is focused on such a problem, and an objective of the present invention is to provide a liquid discharge structure which can improve the discharge capacity for liquid collected inside a casing while suppressing liquid being introduced into a discharge opening from the outside.

In order to achieve the above-mentioned objective, a liquid discharge structure includes a plate-shaped bottom wall with a discharge opening for liquid, the liquid being collected inside a casing which is configured to be installed in a vehicle. The liquid discharge structure further includes a blocking wall outside the bottom wall, wherein the blocking wall is overlapped with the discharge opening in a plan view on the bottom wall and opposed to the bottom wall with a gap between the blocking wall and the bottom wall. The liquid discharge structure further includes a fixing mechanism which is disposed not to be overlapped with the discharge opening in the plan view, wherein the fixing mechanism is configured to fix the blocking wall relative to the bottom wall in an attachable and detachable manner.

With the liquid discharge structure as described above, it is possible to suppress liquid entering the discharge opening from the outside by the blocking wall disposed outside the bottom wall so as to be overlapped with the discharge opening. Furthermore, by the fixing mechanism which is disposed so as not to be overlapped with the discharge opening, the fixing mechanism being configured to fix the blocking wall in an attachable and detachable manner, a discharge path for liquid can be ensured which extends from the discharge opening to a gap between the blocking wall and the bottom wall, whereby improvement of the discharge capacity can be enabled. In this manner, the liquid discharge structure as described above can suppress the liquid entering the discharge opening from the outside while improving the discharge capacity for liquid, the liquid being collected within the casing.

DETAILED DESCRIPTION OF THE PREFERRED EMBODIMENTS

Hereinafter, embodiments of a liquid discharge structure will be described. First, a first embodiment will be described.

Figure 1:
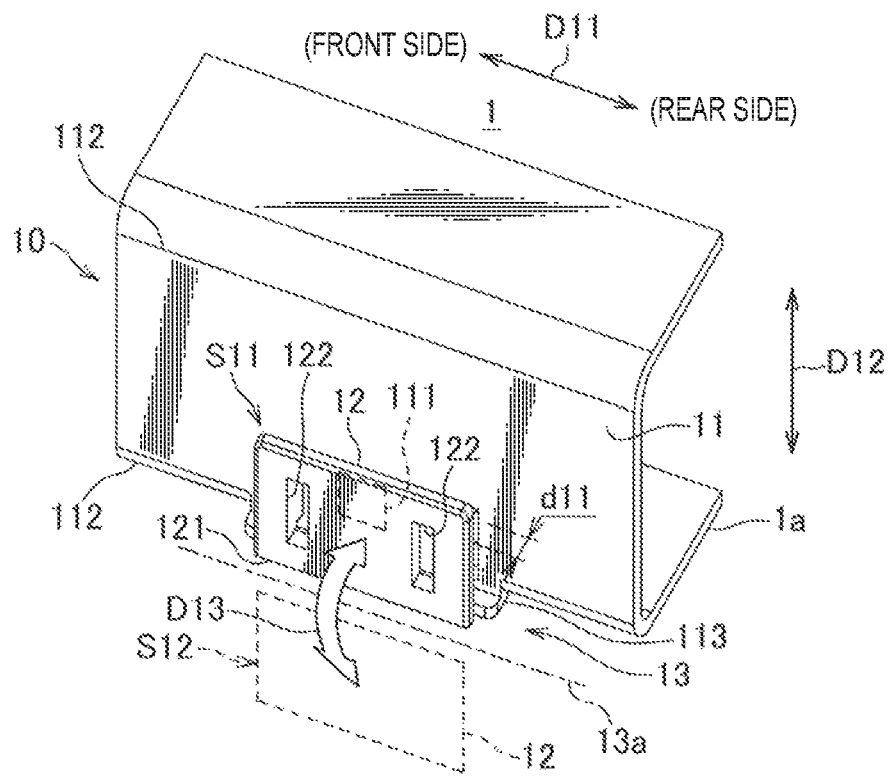
FIG. 1 shows a liquid discharge structure according to a first embodiment in a perspective view from the outside of a casing.
Figure 2:
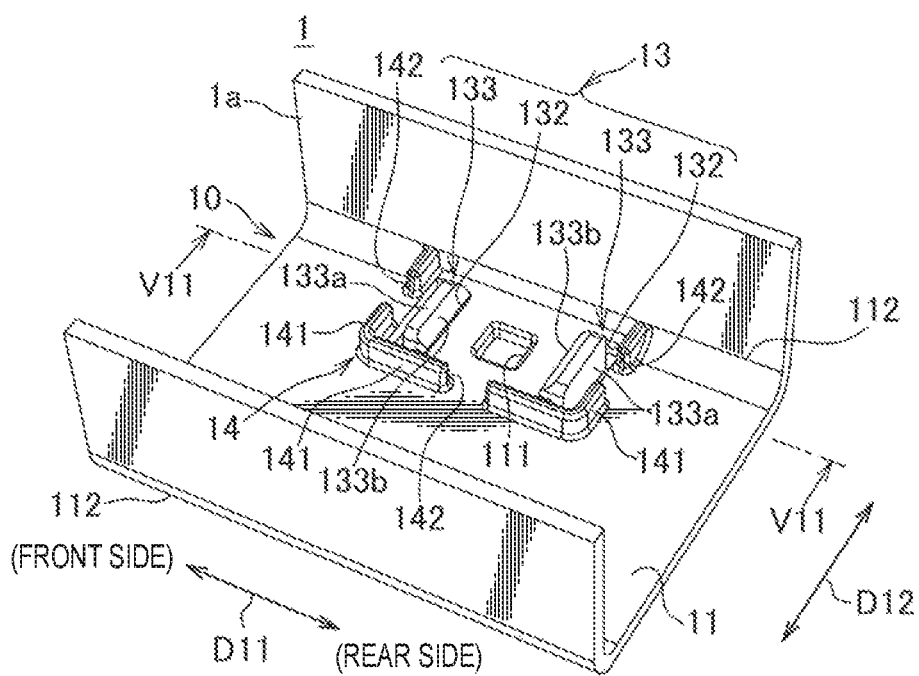
FIG. 2 shows the liquid discharge structure according to FIG. 1 in a perspective view from the inside of the casing.

FIG. 1 shows a liquid discharge structure according to a first embodiment in a perspective view from the outside of a casing. FIG. 2 shows the liquid discharge structure according to FIG. 1 in a perspective view from the inside of the casing.

The liquid discharge structure 10 according to FIGS. 1 and 2 is provided in a casing, such as a casing 1, as described below:

As used herein, the casing 1 is a casing for an electrical junction box or a protector to be installed in a vehicle, wherein the electrical junction box provides an electrical connection between wire harnesses or between a wire harness and another electric device, wherein the protector covers a wire harness and protects it, although the casing 1 is not limited here. The liquid discharge structure 10 is a structure for discharging liquid collected within such a casing 1, and includes a bottom wall 11 of the casing 1, a blocking wall 12, a fixing mechanism 13, and a rib wall 14. In FIGS. 1 and 2, a right-left direction in the Figures corresponds to a front-rear direction D11 of the vehicle, wherein a left side in the Figures corresponds to a front side of the vehicle, and a right side in the Figure corresponds to a rear side of the vehicle.

The bottom wall 11 is a wall having a rectangular, flat plate shape, and provided with a discharge opening 111 for liquid which is collected within the casing 1. The discharge opening 111 is formed at a position closer to one 112 of a pair of lateral sides 112 opposed to each other with regard to a width direction D12 of the vehicle, wherein the pair of lateral sides 112 extends along the front-rear direction D11 at the bottom wall 11. The blocking wall 12 is a wall having a rectangular plate shape which is disposed outside the bottom wall 11 so that the blocking wall 12 is overlapped with the discharge opening 111 in a plan view on the bottom wall 11 and opposed to the bottom wall 11 with a gap d11 between the blocking wall 12 and the bottom wall 11. According to the present embodiment, the gap dl is configured as a substantially same distance as a thickness of the blocking wall 12.

The fixing mechanism 13 is provided so as not to be overlapped with the discharge opening 111 in the plan view on the bottom wall 11, and fixes the blocking wall 12 relative to the bottom wall 11 in an attachable and detachable manner. This fixing mechanism 13 will be described later with reference to other figures.

The rib wall 14 is a wall formed on an inner surface of the bottom wall 11 so as to surround the discharge opening 111. This rib wall 14 is connected at its both ends to a lateral wall 1a of the casing 1 which is closer to the discharge opening 111, wherein the rib wall 14 are formed in a C-frame shape so as to surround the discharge opening 111 in a rectangular shape together with the lateral wall 1a. Further, the rib wall 14 has one recess 142 in each of three wall portions 141. Each of the recesses 142 has a function to pass liquid therethrough on an inner surface side of the bottom wall 11, the liquid flowing towards the discharge opening 111.

Next, the fixing mechanism 13 which fixes the blocking wall 12 relative to the bottom wall 11 in an attachable and detachable manner will be described. First, the blocking wall 12 according to the present embodiment is configured to be attached and detached by rotating the blocking wall 12 around a rotation axis 13a between a first state S11 and a second state S12, as indicated by an arrow D13 in FIG. 1, wherein the rotation axis 13a extends along the lateral side 112 of the bottom wall 11 closer to the discharge opening 111. The first state S11 is a state in which the blocking wall 12 is opposed to the bottom wall 11 so as to be overlapped with the discharge opening 111. The second state S12 is a state in which the blocking wall 12 is rotated by 180 degree around the rotation axis 13a and thus separated away from the bottom wall 11.

Figure 3:
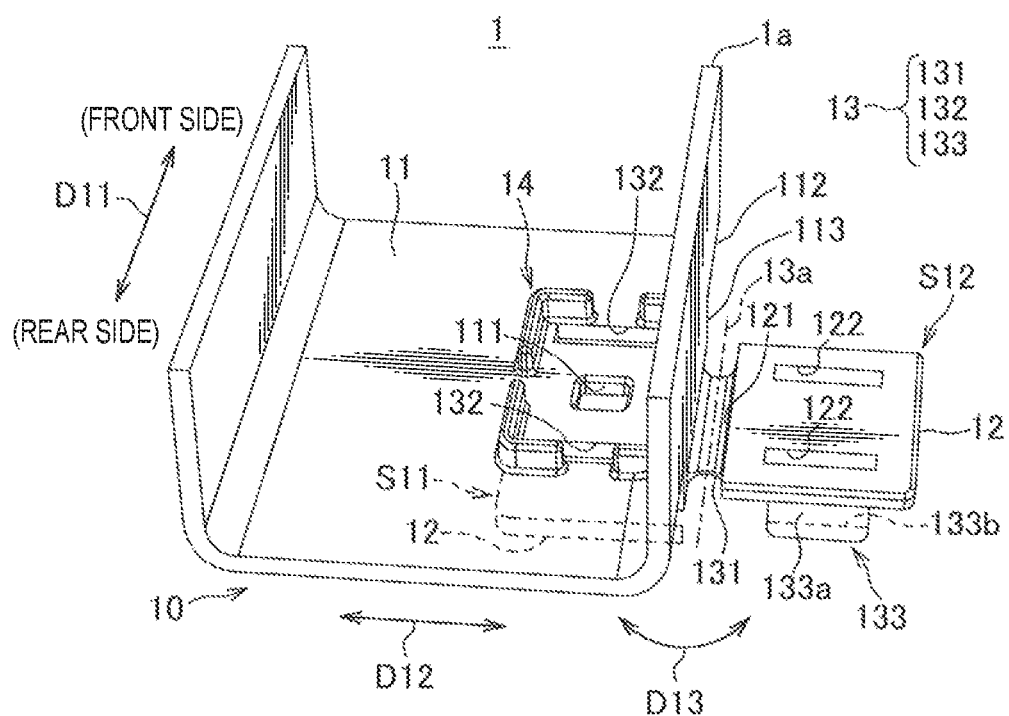
FIG. 3 shows the liquid discharge structure according to FIGS. 1 and 2 with a blocking wall in a second state in a perspective view from the inside of the casing.

FIG. 3 shows the liquid discharge structure according to FIGS. 1 and 2 with a blocking wall in a second state in a perspective view from the inside of the casing. In FIG. 3, a depth direction in the Figure corresponds to the front-rear direction D11 of the vehicle, wherein a background side in the Figure corresponds to the front side of the vehicle, and a foreground side in the Figure corresponds to the rear side of the vehicle. Further, a right-left direction in the Figure corresponds to the width direction D12 of the vehicle.

As shown in FIGS. 1 to 3, the fixing mechanism 13 includes a hinge section 131, engaged holes 132, and engaging sections 133.

The hinge section 131 couples the blocking wall 12 to the bottom wall 11 of the casing 1 so as to allow the blocking wall 12 to be rotated around the rotation axis 13a between the first and second state S11 and S12 as described above in a direction of an arrow D13. A portion of a lower end of a lateral wall 1a projects as an extended protrusion 113 from the lateral side 112 of the bottom wall 11 closer to the discharge opening 111, the lateral wall 1a being connected to this lateral side 112. The hinge section 131 couples the lower end edge of this extended protrusion 113 to one of lateral edges 121 of the blocking wall 12, the lateral edges 121 extending along the front-rear direction D11. In the first state S11, the blocking wall 12 is in contact with the lower end edge of the extended protrusion 113. With this contact, the gap d11 is formed at a distance between the bottom wall 11 and the blocking wall 12, the distance depending on an amount of projection of the extended protrusion 113. Further, according to the present embodiment, the bottom wall 11, the blocking wall 12 and the fixing mechanism 13 are integrally moulded from resin, wherein the hinge section 131 is formed as a bendable section with a smaller thickness than the blocking wall 12 and the bottom wall 11.

The engaged holes 132 are through-holes having a rectangular slit shape which extends in the width direction D12 of the vehicle, wherein two engaged holes 132 are provided inside the rib wall 14 with a rectangular frame shape on the bottom wall 11 so as to be arranged in a direction extending along the rotation axis 13a with the discharge opening 111 interposed between the engaged holes 132.

Each of the engaging sections 133 includes a main body section 133a and an engaging claw 133b, wherein the main body section 133a has a rectangular plate shape and the engaging claw 133b projects from a tip portion of the main body section 133a, and wherein two engaging sections 133 are arranged vertically on the blocking wall 12 for the two engaged holes 132. These engaging sections 133 are arranged vertically on the blocking wall 12 so that in the first state S11 the tip portions of the main body sections 133a enter the engaged holes 132 in the bottom wall 11, wherein the engaging claws 133b project from the tip portions of the main body sections 133a, the engaging claws 133b being configured to be engaged with edges of the engaged holes 132. The two engaging sections 133 are arranged vertically so that their main body sections 133a are opposed to each other. Further, the engaging claw 133b of each of the engaging sections 133 is formed so as to project towards the other opposing engaging section 133. In the first state S11, the engaging claws 133b are engaged with and locked in the engaged holes 132 at their edges which are located farther from the rib wall 14 and closer to the discharge opening 111. In this case, the engaged holes 132 are formed wider than the main body sections 133a so as to allow the tip portions of the engaging sections 133 to enter the engaged holes 132, the tip portions including the engaging claws 133b disposed thereon. When the engaging claws 133b are locked to the edges of the engaged holes 132 closer to the discharge opening 111, the wider configuration as described above results in gaps between the main body sections 133a and the respective opposite edges of the engaged holes 132, the opposite edges being located closer to the rib wall 14. These gaps have a function to discharge liquid out of the casing 1 together with the discharge opening 111.

Further, according to the present embodiment, through-holes 122 are provided in the blocking wall 12 adjacent to roots of the engaging sections 133 so that the engaging claws 133b are visible when viewing the blocking wall 12 from an opposite side to the engaging sections 133. As described above, the liquid discharge structure 10 according to the present embodiment is integrally moulded, specifically in a shape in which the blocking wall 12 is opened and brought in the second state S12, as shown in FIG. 3. The moulding in this shape is performed by means of an upper and a lower mould which are configured to clamp the bottom wall 11 and the blocking wall 12 in a up-down direction in FIG. 3. The through-holes 122 adjacent to the roots of the engaging sections 133 come into contact with demoulding traces, wherein the demoulding traces are formed when removing mould portions in the upper mould upwards, the mould portions being provided for shaping projection shapes of the engaging claws 133b of the engaging sections 133.

The liquid discharge structure 10 as described above can achieve effects as described later. Before describing the effects, a reference for comparison with this liquid discharge structure 10 will be described first.

Figure 4:
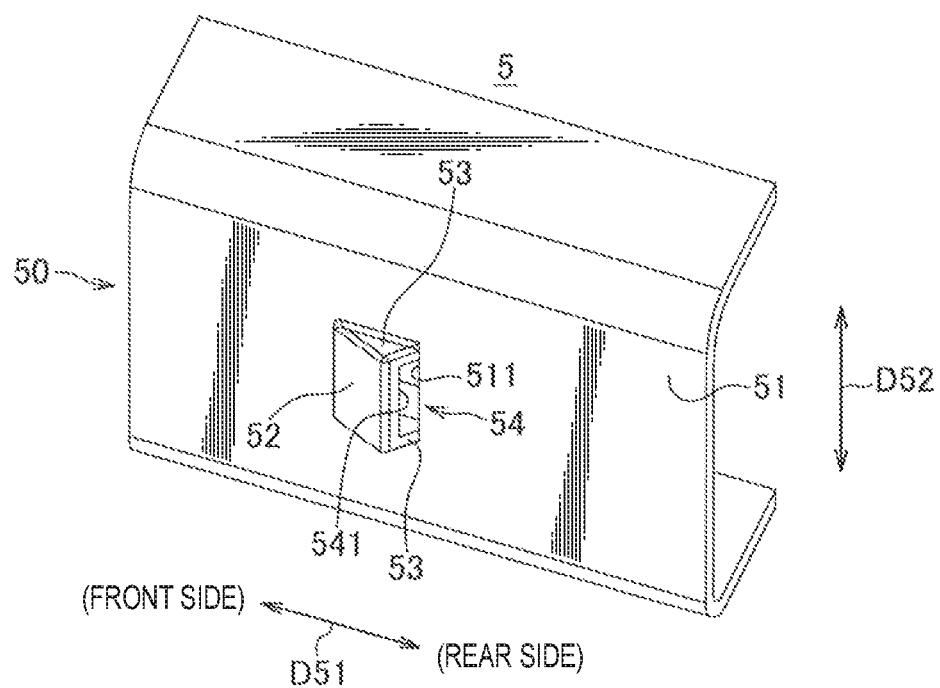
FIG. 4 shows a liquid discharge structure according to a reference for comparison with the liquid discharge structure according to FIGS. 1 to 3 in a perspective view from the outside of the casing.
Figure 5:
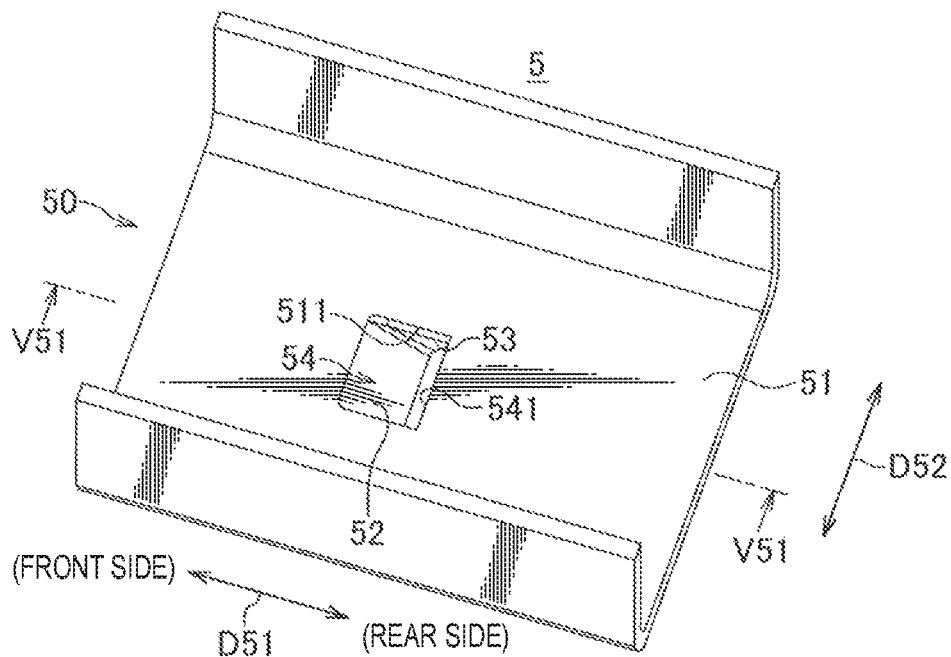
FIG. 5 shows the liquid discharge structure according to the reference as shown in FIG. 4 in a perspective view from the inside of the casing.

FIG. 4 shows a liquid discharge structure according to a reference for comparison with the liquid discharge structure according to FIGS. 1 to 3 in a perspective view from the outside of the casing. FIG. 5 shows the liquid discharge structure according to the reference as shown in FIG. 4 in a perspective view from the inside of the casing. Likewise, a right-left direction in FIGS. 4 and 5 corresponds to a front-rear direction D51 of a vehicle, wherein a left side in the Figures corresponds to a front side of the vehicle, and a right side in the Figures corresponds to a rear side of the vehicle.

Likewise, the liquid discharge structure 50 according to the reference is a structure for discharging liquid collected within a casing 5, the casing 5 being installed in the vehicle, wherein the liquid discharge structure 50 includes a bottom wall 51 of the casing 5, a blocking wall 52, and a pair of vertical walls 53.

The bottom wall 51 is a wall having a flat plate shape, and provided with a discharge opening 511 for liquid which is collected within the casing 5. The blocking wall 52 is a tilted wall extending obliquely externally from the casing 5 with an amount which is gradually increased in the front-rear direction D51 of the vehicle from an edge of the discharge opening 511 towards the rear side of the vehicle, the edge being located towards the front side of the vehicle. The vertical walls 53 are a pair of walls, each of the walls having a triangular shape, wherein the vertical walls 53 connect a pair of inner edges of the discharge opening 511 to a pair of lateral edges of the blocking wall 52, the pair of inner edges of the discharge opening 511 being opposed to each other in a width direction D52 of the vehicle. The blocking wall 52 and the pair of vertical walls 53 define the above-described discharge opening 511 which opens inwardly in the casing 5. As such, a discharge path 54 is defined with an external discharge opening 541 which is oriented externally from the casing 5, wherein the external discharge opening 541 is defined by the blocking wall 52, the pair of vertical walls 53 and an rear end edge of the discharge opening 511. With the liquid discharge structure 50 according to this reference, liquid collected within the casing 5 is discharged, while external liquid is prevented from entering, as described below.

Figure 6:
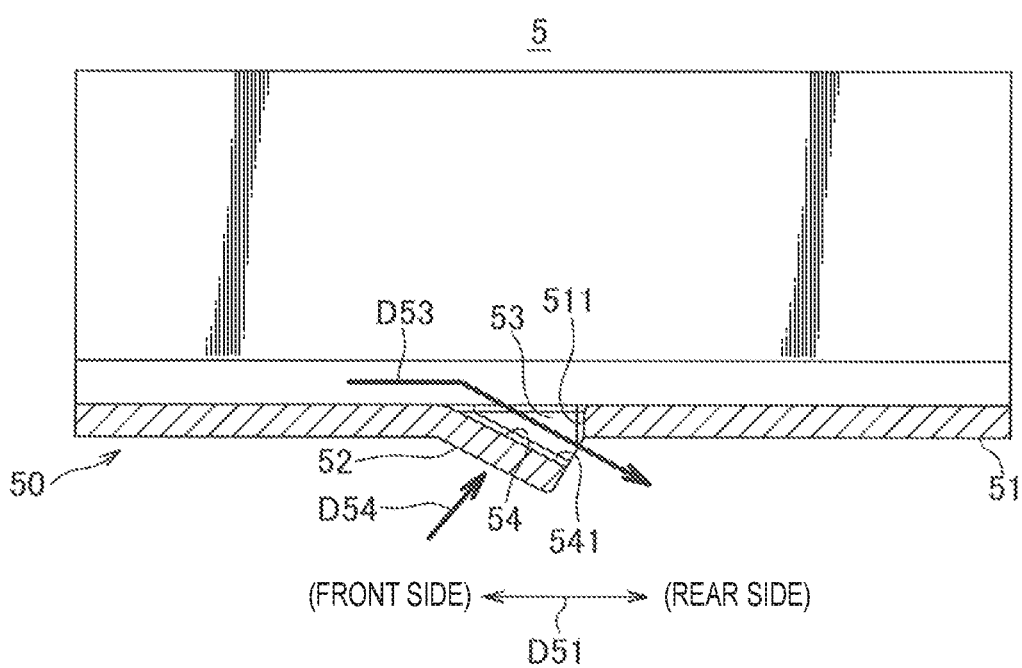
FIG. 6 is a sectional view along the line V51-V51 in FIG. 5 illustrating how liquid is discharged and prevented from being introduced in the liquid discharge structure according to the reference as shown in FIGS. 4 and 5.

FIG. 6 is a sectional view along the line V51-V51 in FIG. 5 illustrating how liquid is discharged and prevented from being introduced in the liquid discharge structure according to the reference as shown in FIGS. 4 and 5. Likewise, a right-left direction in FIG. 6 corresponds to the front-rear direction D51 of the vehicle, wherein a left side in the figure corresponds to the front side of the vehicle, and right side in the figure corresponds to the rear side of the vehicle.

In the liquid discharge structure 50 according to the reference, liquid collected within the casing 5 flows through the discharge opening 511 in the bottom wall 51 into the discharge path 54, as indicated by an arrow D53. Then, the liquid flows through this discharge path 54 from the front side to the rear side with regard to the front-rear direction D51 of the vehicle and is discharged through the external discharge opening 541 to the rear side. In the liquid discharge structure 50 according to this reference, liquid attempts to enter from the front side of the vehicle, as indicated by an arrow D54, wherein the liquid is prevented from entering the casing 5 by blocking the liquid with the blocking wall 52 and the pair of vertical walls 53.

Figure 7:
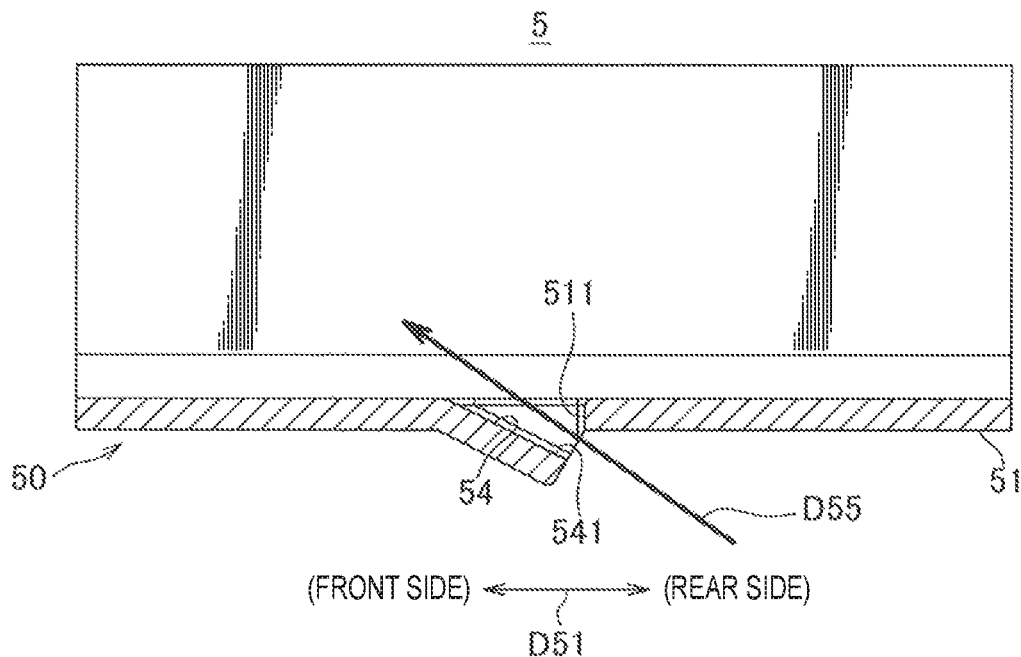
FIG. 7 is a sectional view similar to FIG. 6, wherein it is shown that there is a room for improvement in view of suppressing liquid entering from the outside in the liquid discharge structure according to the reference as shown in FIGS. 4 and 5.

It can be seen that the liquid discharge structure 50 according to the reference has room for further improvement of the discharge capacity, since the liquid discharge is limited to discharge towards the rear side of the vehicle. Also in view of suppressing liquid entering from the outside, there is also room for improvement as follows:

FIG. 7 is a sectional view similar to FIG. 6, wherein it is shown that there is a room for improvement in view of suppressing liquid entering from the outside in the liquid discharge structure according to the reference as shown in FIGS. 4 and 5. Likewise, a right-left direction in FIG. 7 corresponds to the front-rear direction D51 of the vehicle, wherein a left side in the figure corresponds to the front side of the vehicle, and right side in the figure corresponds to the rear side of the vehicle.

As mentioned above, with the liquid discharge structure 50 according to the reference, it is prevented that liquid enters the casing 5 from the front side of the vehicle with regard to the front-rear direction D51. On the other hand, liquid coming from the rear side may be allowed to enter the casing 5 via the external discharge opening 541, the discharge path 54, and the discharge opening 511 in the bottom wall 51, as indicated by an arrow D55. As such, it can be also seen that the liquid discharge structure 50 according to the reference has room for further improvement in view of suppressing liquid entering from the outside.

Figure 8:
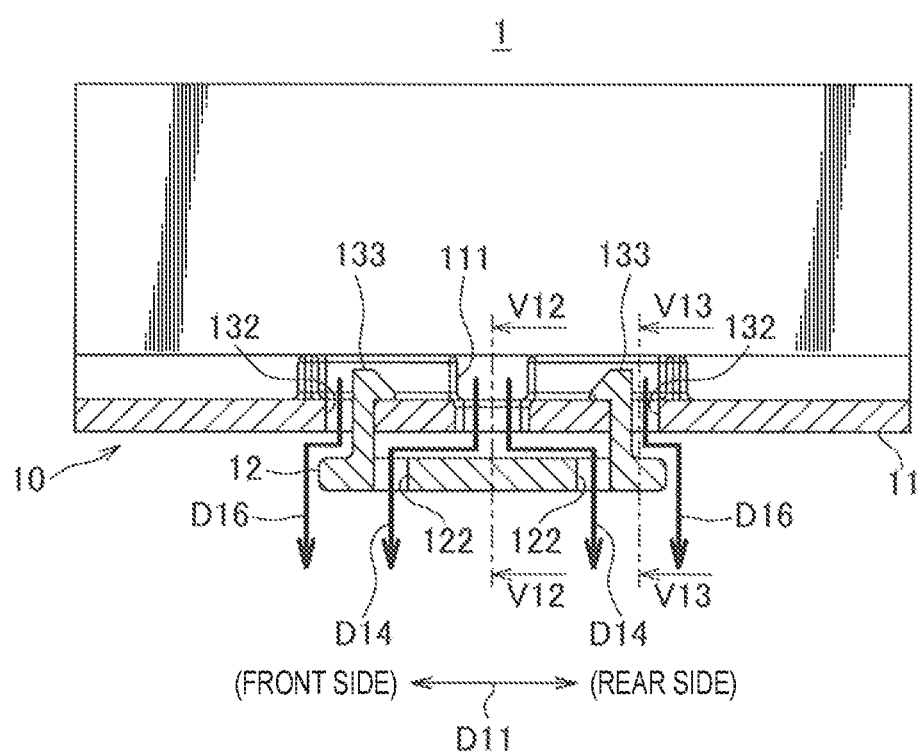
FIG. 8 is a sectional view along the line V11-V11 in FIG. 2 illustrating how the discharge capacity for liquid is increased in the liquid discharge structure according to FIGS. 1 and 2.

In contrast, the liquid discharge structure 10 as shown in FIGS. 1 and 2 can achieve effects as described below. First, the liquid discharge structure 10 can achieve improvement effects in view of the liquid discharge capacity as follows:

FIG. 8 is a sectional view along the line V11-V11 in FIG. 2 illustrating how the discharge capacity for liquid is increased in the liquid discharge structure according to FIGS. 1 and 2. Likewise, a right-left direction in FIG. 8 corresponds to a front-rear direction D11 of the vehicle, wherein a left side in the Figure corresponds to a front side of the vehicle, and a right side in the Figure corresponds to a rear side of the vehicle.

Figure 9:
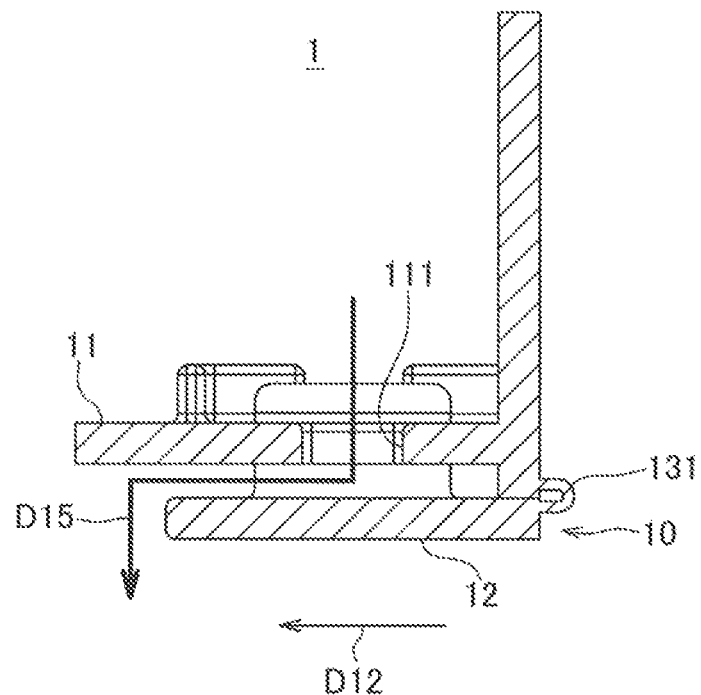
FIG. 9 is a sectional view along the line V12-V12 in FIG. 8 illustrating how the discharge capacity for liquid is increased in the liquid discharge structure according to FIGS. 1 and 2.
Figure 10:
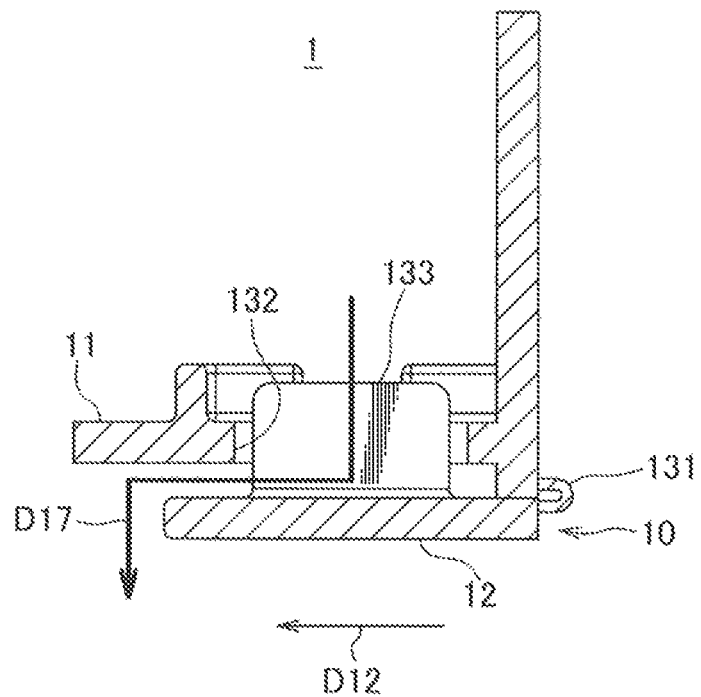
FIG. 10 is a sectional view along the line V13-V13 in FIG. 8 illustrating how the discharge capacity for liquid is increased in the liquid discharge structure according to FIGS. 1 and 2.

FIG. 9 is a sectional view along the line V12-V12 in FIG. 8 illustrating how the discharge capacity for liquid is increased in the liquid discharge structure according to FIGS. 1 and 2. FIG. 10 is a sectional view along the line V13-V13 in FIG. 8 illustrating how the discharge capacity for liquid is increased in the liquid discharge structure according to FIGS. 1 and 2. In FIGS. 9 and 10, a right-left direction in the Figures corresponds to the width direction D12 of the vehicle.

In the liquid discharge structure 10, some of liquid which passed through the discharge opening 111 in the bottom wall 11 of the casing 1 flows on the blocking wall 12, and is discharged downwards through the two through-holes 122, as indicated by arrows D14 in FIG. 8. Furthermore, some of the liquid which passed through the discharge opening 111 flows on the blocking wall 12 to an end edge of the blocking wall 12 which is opposite to the hinge section 131, wherein the liquid is discharged downwards as well from this end edge, as indicated by an arrow D15 in FIG. 9.

Additionally, in this liquid discharge structure 10, a portion of liquid is discharged to the outside of the casing 1 through the gaps between the engaging sections 133 and the respective inner edges of the two engaged holes 132 in the bottom wall 11, as indicated by arrows D16 in FIG. 8. Liquid which passed through each of the gaps is discharged downwards from one of a front and rear end edge of the blocking wall 12. Further, the liquid which passed through each of the gaps flows in the vicinity of one of the front and rear end edge of the blocking wall 12 to its end edge opposite to the hinge section 131, and discharged downwards from the end edge as well, as indicated by an arrow D17 in FIG. 10.

In this manner, in the liquid discharge structure 10, liquid within the casing 1 is discharged through a plurality of routs. This means that the liquid discharge structure 10 can improve the discharge capacity for liquid better than the liquid discharge structure 50 according to the reference as shown in FIGS. 3 to 6.

Figure 11:
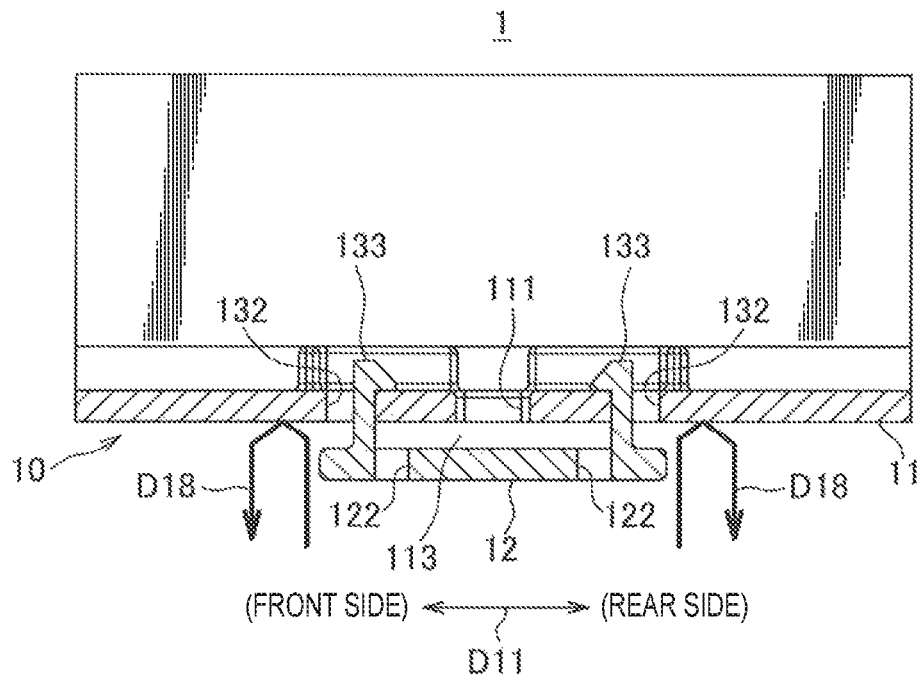
FIG. 11 is a sectional view similar to FIG. 8, wherein it is shown how the suppression capacity for liquid being introduced from the outside is increased in the liquid discharge structure according to FIGS. 1 and 2.

Furthermore, the liquid discharge structure 10 can achieve improvement effects in view of suppressing liquid entering from the outside as follows:

FIG. 11 is a sectional view similar to FIG. 8, wherein it is shown how the suppression capacity for liquid being introduced from the outside is increased in the liquid discharge structure according to FIGS. 1 and 2. Likewise, a right-left direction in FIG. 11 corresponds to a front-rear direction D11 of the vehicle, wherein a left side in the Figure corresponds to the front side of the vehicle, and a right side in the Figure corresponds to the rear side of the vehicle.

According to this liquid discharge structure 10, the discharge opening 111 in the bottom wall 11 is surrounded by the blocking wall 12, the hinge section 131 (FIGS. 9 and 10), the extended protrusion 113 connected to the hinge section 131, and the two engaging sections 133. As a result, it is possible to suppress liquid entering the casing 1 from the outside, as indicated by arrows D18. I.e., the introduction of the liquid can be suppressed on both of the front and the rear side of the vehicle in the front-rear direction D11. Furthermore, the discharge opening 111 and the engaged holes 132 in the bottom wall 11 are offset from the through-holes 122 in the blocking wall 12 in a plan view on the bottom wall 11, whereby liquid from these holes is prevented from entering the casing 1 as well. This means that the liquid discharge structure 10 can improve the capacity of suppressing liquid entering from the outside better than the liquid discharge structure 50 according to the reference as shown in FIGS. 3 to 6.

In addition to the fact that the improvement effects can be achieved for the capabilities of liquid discharge and of suppressing liquid entering from the outside as described above, the liquid discharge structure 10 as shown in FIGS. 1 and 2 can enable further improvement of the liquid discharge capacity as follows:

In this liquid discharge structure 10, the fixing mechanism 13 for fixing the blocking wall 12 in an attachable and detachable manner is disposed so as not to be overlapped with the discharge opening 111. This means that a discharge path for liquid is ensured which extends from the discharge opening 111 to a gap between the blocking wall 12 and the bottom wall 11. The improvement of the discharge capacity can be also enabled in this point. In this manner, the liquid discharge structure 10 can improve the discharge capacity for liquid collected within the casing 1 while suppressing liquid entering the discharge opening 111 from the outside.

Here, in the present embodiment, the liquid discharge structure 10 includes the rib wall 14 formed on the inner surface of the bottom wall 11, wherein the rib wall 14 surrounds the discharge opening 111 at least partially. According to this configuration, attachment and detachment of the blocking wall 12 is performed at the bottom wall 11, wherein a region in the vicinity of the discharge opening 111 is reinforced by the rib wall 14, the region being expected to be subject to an external force which may accompany the attachment and/or the detachment. This can improve the durability against such an external force.

Furthermore, the rib wall 14 according to the present embodiment includes recesses 142 which allow liquid to pass therethrough within the inner surface of the bottom wall 11 to the discharge opening 111. With this configuration, a flow of the liquid is not prevented by the rib wall 14, which can ensure a constant discharge capacity while enabling reinforcement by the rib wall 14.

Furthermore, according to the present embodiment, the fixing mechanism 13 includes the hinge section 131, the engaged holes 132 in the bottom wall 11, and the engaging sections 133 disposed vertically on the blocking wall 12, wherein the engaging sections 133 have the engaging claws 133b in the tip portion of the blocking wall 12, the engaging sections 133 being configured to be engaged with edges of the engaged holes 132. According to this configuration, the blocking wall 12 is attachable and detachable, wherein at the same time, the blocking wall 12 is configured to be coupled to the bottom wall 11 via the hinge section 131 even in the second state S12 in which the blocking wall 12 is separated away from the bottom wall 11. This coupling can suppress, for example, that components are left in several places, so that an operability can be improved in assembling the liquid discharge structure 10 at the casing 1. In addition, the engaging sections 133 prevent that liquid from the outside enters the engaged holes 132, wherein at the same time, the engaged holes 132 function as discharge openings for liquid within the casing 1. I.e., with the engaged holes 132, the discharge capacity can be further improved.

Furthermore, according to the present embodiment, the through-holes 122 are provided in the blocking wall 12 adjacent to the roots of the engaging sections 133 so that the engaging claws 133b are visible when viewing the blocking wall 12 from an opposite side to the engaging sections 133. For integrally moulding the blocking wall 12 and the engaging sections 133 from resin, this configuration can enable a protrusion shape of the engaging claws 133b to be easily shaped only with moulds for clamping the blocking wall 12 on a front and back side, without a slide mould which is removed by sliding it along the blocking wall 12. Furthermore, the through-holes 122 in the blocking wall 12 represent additional discharge openings for liquid exiting the discharge opening 111, and thus, can further improve the discharge capacity.

Further, according to the present embodiment, two engaged holes 132 are arranged in the bottom wall 11 in a direction along the rotation axis 13a for the blocking wall 12, with the discharge opening 111 interposed between the two engaged holes 132, wherein two engaging sections 133 are arranged vertically on the blocking wall 12 for the two engaged holes 132. This configuration can improve a fixing strength for the blocking wall 12 by means of the two engaging sections 133, wherein the discharge capacity can be further improved with the two engaged holes 132.

Further, according to the present embodiment, the bottom wall 11, the blocking wall 12 and the fixing mechanism 13 are integrally moulded from resin, wherein the hinge section 131 is formed as a bendable section with a smaller thickness than the blocking wall 12 and the bottom wall 11. This configuration can reduce the number of components for the casing 1 and thus the component costs, since the above-mentioned components are integrally moulded from resin, including the hinge section 131 as a movable section.

Moreover, according to the present embodiment, the casing 1 is a casing for an electrical junction box or for a protector which protects a wire harness. With this configuration, the above-described liquid discharge structure 10 is applied to a casing for an electrical junction box or a protector which is oft disposed in a lower portion of a vehicle and thus subject to liquid intrusion from the outside. With such application, the effects and the capacities of this liquid discharge structure 10 can be utilized effectively.

Next, a second embodiment will be described.

Figure 12:
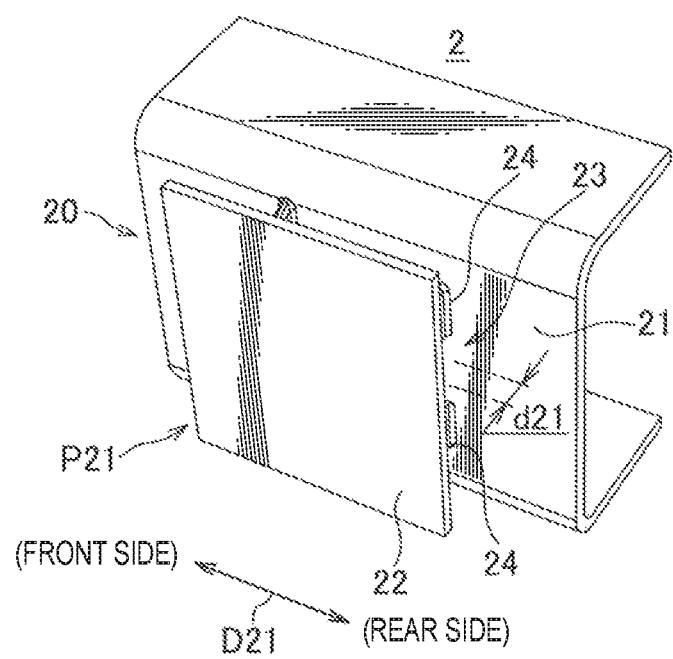
FIG. 12 shows a liquid discharge structure according to a second embodiment in a perspective view from the outside of a casing.
Figure 13:
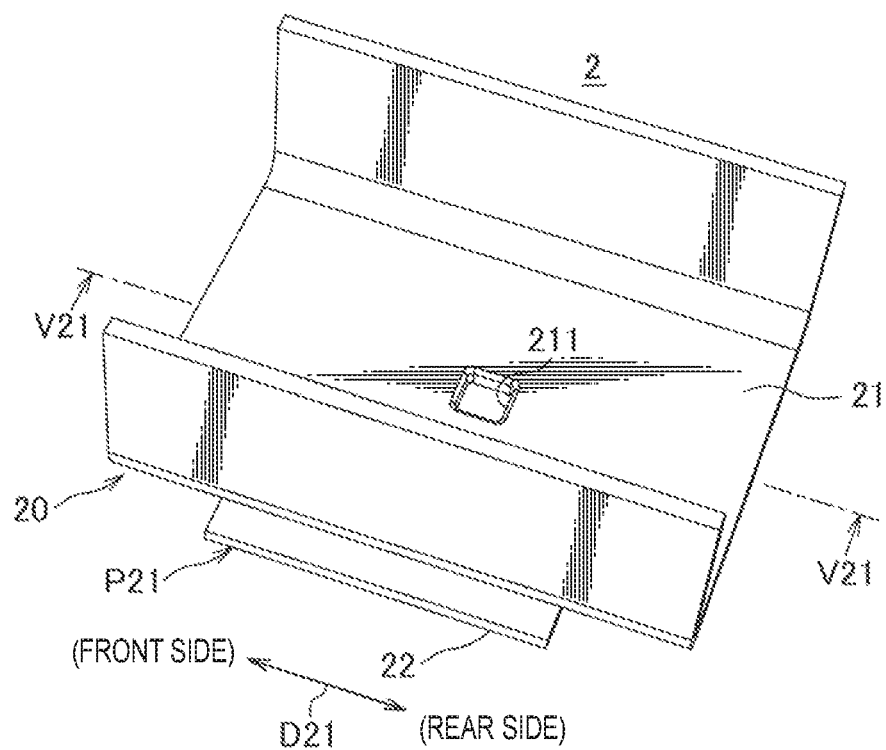
FIG. 13 shows the liquid discharge structure according to FIG. 12 in a perspective view from the inside of the casing, wherein an internal configuration inside the casing is shown.
Figure 14:
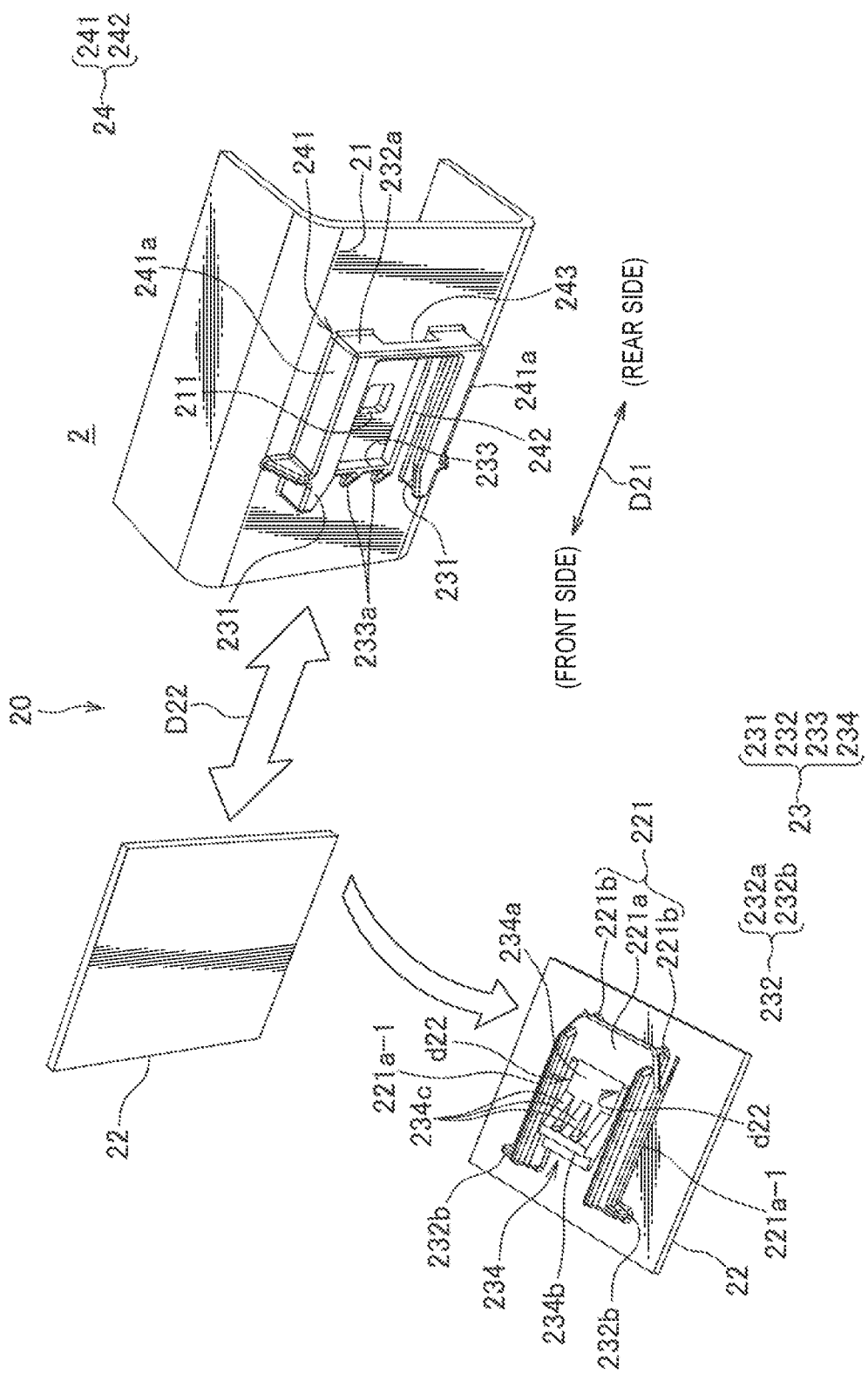
FIG. 14 is an exploded perspective view of the liquid discharge structure according to FIG. 12.

FIG. 12 shows a liquid discharge structure according to a second embodiment in a perspective view from the outside of a casing. FIG. 13 shows the liquid discharge structure according to FIG. 12 in a perspective view from the inside of the casing. FIG. 14 is an exploded perspective view of the liquid discharge structure according to FIG. 12. In FIGS. 12 to 14, a right-left direction in the Figures corresponds to a front-rear direction D21 of the vehicle, wherein a left side in the Figures corresponds to a front side of the vehicle, and a right side in the Figures corresponds to a rear side of the vehicle.

The liquid discharge structure 20 according to FIGS. 12 to 14 is configured to be provided at a casing 2 which is similar to that of the first embodiment. I.e., as used herein, the casing 2 is a casing for an electrical junction box or a protector to be installed in a vehicle similarly, wherein the protector protects a wire harness. The liquid discharge structure 20 is a structure for discharging liquid collected within such a casing 2, and includes a bottom wall 21 of the casing 2, a blocking wall 22, a fixing mechanism 23, and a rib wall 24.

The bottom wall 21 is a wall having a rectangular, flat plate shape, and provided with a discharge opening 211 for liquid which is collected within the casing 2. The discharge opening 211 is formed substantially at a center in the bottom wall 21. The blocking wall 22 is a wall having a rectangular plate shape which is disposed outside the bottom wall 21 so that the blocking wall 22 is overlapped with the discharge opening 211 in a plan view on the bottom wall 21 and opposed to the bottom wall 21 with a gap d21 between the blocking wall 22 and the bottom wall 21.

The fixing mechanism 23 is provided so as not to be overlapped with the discharge opening 211 in the plan view on the bottom wall 21, and fixes the blocking wall 22 relative to the bottom wall 21 in an attachable and detachable manner. This fixing mechanism 23 will be described later with reference to other figures.

As shown in FIG. 14, the rib wall 24 is provided on an outer surface of the bottom wall 21 and surrounds the discharge opening 211 in the casing 2 in a rectangular frame shape with two walls, i.e. an outer enclosure wall 241 and an inner enclosure wall 242. The outer enclosure wall 241 is formed in a C-frame shape so as to surround the discharge opening 211 on three sides, with a side of the outer enclosure wall 241 being open which is located towards the front side of the vehicle. One of the three walls forming the outer enclosure wall 241 which is located towards the rear side of the vehicle is provided with a recess 243, wherein the recess 243 is configured to pass liquid therethrough, the liquid exiting the discharge opening 211 on an outer surface side of the bottom wall 21. The inner enclosure wall 242 is disposed inside the outer enclosure wall 241, wherein the inner enclosure wall 242 is formed in a C-frame shape so as to surround the discharge opening 211 in a rectangular shape, with both opposite ends of the inner enclosure wall 242 being connected to the rear wall of the outer enclosure wall 241.

Next, the fixing mechanism 23 which fixes the blocking wall 22 relative to the bottom wall 21 in an attachable and detachable manner will be described. As shown in FIG. 14, the fixing mechanism 23 is configured to fix the blocking wall 22 relative to the bottom wall 21 in a slidingly attachable and detachable manner in a sliding direction D22, wherein the sliding direction D22 extends along the outer surface of the bottom wall 21 and along the front-rear direction D21 of the vehicle.

Figure 15:
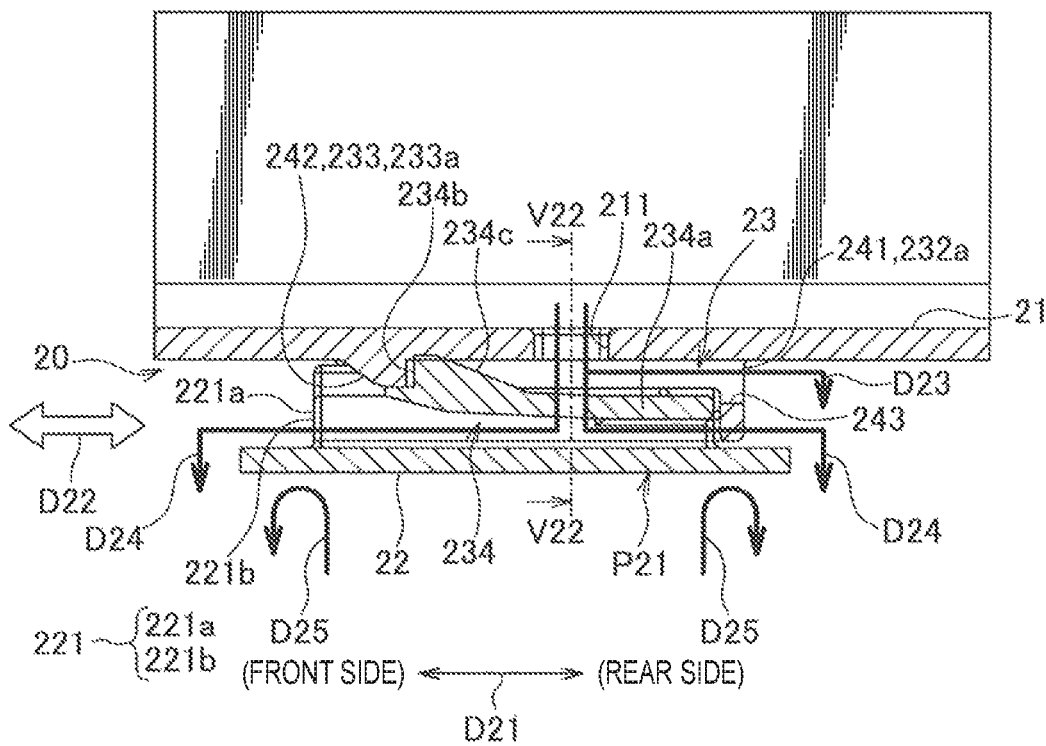
FIG. 15 is a sectional view along the line V21-V21 in FIG. 13 illustrating how a blocking wall is fixed relative to a bottom wall by means of a fixing mechanism in a slidingly attachable and detachable manner.
Figure 16:
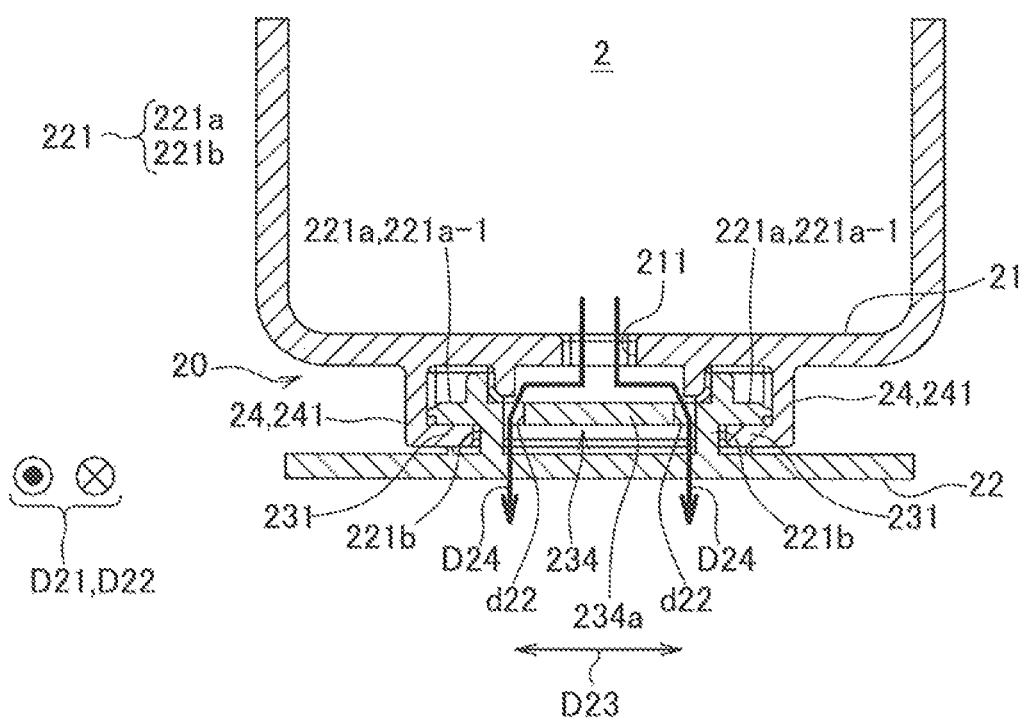
FIG. 16 is a sectional view along the line V22-V22 in FIG. 15 illustrating how the blocking wall is fixed relative to the bottom wall by means of the fixing mechanism in a slidingly attachable and detachable manner.

FIG. 15 is a sectional view along the line V21-V21 in FIG. 13 illustrating how a blocking wall is fixed relative to a bottom wall by means of the fixing mechanism in a slidingly attachable and detachable manner. FIG. 16 is a sectional view along the line V22-V22 in FIG. 15 illustrating how the blocking wall is fixed relative to the bottom wall by means of the fixing mechanism in a slidingly attachable and detachable manner. In FIG. 15, a right-left direction in the Figure corresponds to a front-rear direction D21 of the vehicle, wherein a left side in the Figure corresponds to a front side of the vehicle, and a right side in the Figure corresponds to a rear side of the vehicle. Further, a right-left direction in FIG. 16 corresponds to the width direction D23 of the vehicle.

As shown in FIGS. 14 to 16, the fixing mechanism 23 includes rail sections 231, stopper sections 232, an engaged section 233, and an engaging section 234.

The rail sections 231 are provided on the bottom wall 21 of the casing 2, and configured to support the blocking wall 22 in a slidingly attachable and detachable manner in the sliding direction D22. The rail sections 231 are wall portion extending inwardly from respective end edges of a pair of lateral walls 241*a* of the outer enclosure wall 241 of the rib wall 24, wherein the pair of lateral walls 241*a* is opposed to each other and extends in the front-rear direction D21. A supported structure 221 is formed on a side of the blocking wall 22 facing the bottom wall 21, wherein the supported structure 221 is configured to be supported by the rail sections 231. The supported structure 221 includes a C-shaped plate 221*a* and a pair of vertical walls 221*b*, wherein the C-shaped plate 221*a* opens towards the front side of the vehicle, and the pair of vertical walls 221*b* are arranged vertically on the blocking wall 22 so as to support a pair of arm portions of the C-shaped plate 221*a*, the pair of arm portions extending in the front-rear direction D21. A pair of lateral edge portions 221*a*-1 of the C-shaped plate 221*a* are configured to be supported by the pair of rail sections 231 in a slidingly attachable and detachable manner in the sliding direction D22 as shown in FIG. 16, the pair of lateral edge portions 221*a* extending along the front-rear direction D21.

Here, front corners of the pair of rail sections 231 and rear corners of the C-shaped plate 221*a* are rounded. The rounding can enable the increased operability regarding insertion of the C-shaped plate 221*a* by sliding between the pair of rail sections 231 for attaching the blocking wall 22.

The stopper sections 232 are provided on the bottom wall 21 and the blocking wall 22 respectively, and configured to limit sliding the blocking wall 22 so as to prevent it from sliding rearwards beyond a blocking position P21 as shown in FIGS. 12, 13 and 15, wherein the blocking wall 22 is overlapped with the discharge opening 211 at the blocking position P21. The rear wall portion of the outer enclosure wall 241 of the rib wall 24 simultaneously represents a bottom wall stopper section 232*a*. As shown in FIG. 15, sliding the blocking wall 22 is limited by a rear end edge of the C-shaped plate 221*a* on the blocking wall 22 coming into contact with the bottom wall stopper section 232*a*. Blocking wall stopper sections 232*b* are a pair of wall portions which is arranged vertically on the blocking wall 22 so that they are connected to a pair of front end edges of the C-shaped plate 221*a*, as shown in FIG. 14. Sliding the blocking wall 22 is limited by the pair of blocking wall stopper sections 232*b* coming into contact with a pair of front ends of the outer enclosure wall 241 of the rib wall 24 on the bottom wall 21. In this manner, the stopper sections 232 limit sliding the blocking wall 22 by contact on both of the front and rear sides in the front-rear direction D21.

A front wall portion of the inner enclosure wall 242 of the rib wall 24 simultaneously represents the engaged section 233. Further, the engaged section 233 includes three triangular ribs 233*a* which extend out of the front wall portion further towards the front side (in FIG. 14, two of the three triangular ribs 233*a* are visible). Each of the triangular ribs 233*a* has a shape projecting from the bottom wall 21 with an amount which is gradually increased towards the rear side.

The engaging section 234 is a portion disposed on the blocking wall 22, which is configured to be locked to the engaged section 233, with the stopper sections 232 being limiting the sliding. This engaging section 234 is configured with a cantilever 234*a* which extends in the sliding direction D22, wherein the cantilever 234*a* has one end as a fixed end and another end as a free end, and a engaging claw 234*b* is provided on a free end side of the cantilever 234*a*. The cantilever 234*a* is disposed inside the C-shaped plate 221*a* of the blocking wall 22, wherein a rear end of the cantilever 234*a* as the fixed end is connected to a rear plate portion of the C-shaped plate 221*a*. There are gaps d22 between lateral edges of the cantilever 234*a* along the front-rear direction D21 and the arm portions of the C-shaped plate 221*a* along the front-rear direction D21, wherein the cantilever 234*a* is deformable by deflection. Furthermore, three triangular ribs 234*c* are formed on a rear side of the engaging claw 234*b*. Each of the triangular ribs 234*c* has a shape projecting from the cantilever 234*a* with an amount which is gradually decreased towards the rear side.

When the blocking wall 22 is slid to the blocking position P21, the engaging claw 234*b* passes across the engaged section 233 on the bottom wall 21 by utilizing deflection of the cantilever 234*a*. At this time, the engaging claw 234*b* passing across the engaged section 233 is guided by oblique sides of the triangular ribs 234*c* of the engaging section 234 which go up oblique sides of the triangular ribs 233*a* of the engaged section 233. As shown in FIG. 15, when the blocking wall 22 reaches the blocking position P21, the engaging claw 234*b* is engaged with and locked in the engaged section 233.

Further in the liquid discharge structure 20 according to the present embodiment, the bottom wall 21, the rib wall 24, the rail sections 231, the bottom wall stopper section 232*a* and the engaged section 233 are integrally moulded from resin as a first moulded component for the casing 2. Further, the blocking wall 22, the supported structure 221, the blocking wall stopper sections 232*b* and the engaging section 234 are integrally moulded from resin as a second moulded component which is separate from the first moulded component.

In the liquid discharge structure 20 as described above, some of liquid which passed through the discharge opening 211 is discharged rearwards through the recess 243, as indicated by an arrow D23 in FIG. 23, the recess 243 being provided in the rear wall portion of the outer enclosure wall 241. Furthermore, some of the liquid which passed through the discharge opening 211 flows to an upper surface of the blocking wall 22 through the gaps d22 between the cantilever 234*a* and the C-shaped plate 221*a*, as indicated by arrows D24 in FIGS. 15 and 16. Then, the liquid flows along the upper surface of the blocking wall 22 in the front-rear direction D21, and is discharged downwards from both of the front and rear end edges.

In this manner, in the liquid discharge structure 20, liquid within the casing 2 is discharged through a plurality of routs. This means that the liquid discharge structure 20 can improve the discharge capacity for liquid in the liquid discharge structure 20 better than the liquid discharge structure 50 according to the reference as shown in FIGS. 3 to 6.

Furthermore, the liquid discharge structure 20 can achieve improvement effects in view of suppressing liquid entering from the outside as follows:

According to this liquid discharge structure 20, the discharge opening 211 is surrounded by the blocking wall 22, the fixing mechanism 23 and the rib wall 24. As a result, it is possible to suppress liquid entering the casing 2 from the outside, as indicated by arrows D25 in FIG. 15. I.e., the introduction of the liquid can be suppressed on both of the front and the rear side of the vehicle in the front-rear direction D21. This means that the liquid discharge structure 20 can improve the capacity of suppressing liquid entering from the outside better than the liquid discharge structure 50 according to the reference as shown in FIGS. 3 to 6.

In addition to the fact that the improvement effects can be achieved for the capability of liquid discharge and of suppressing liquid entering from the outside as described above, the liquid discharge structure 20 as shown in FIGS. 12 to 16 can enable further improvement of the liquid discharge capacity as follows:

In this liquid discharge structure 20, the fixing mechanism 23 for fixing the blocking wall 22 in an attachable and detachable manner is disposed so as not to be overlapped with the discharge opening 211. This means that a discharge path for liquid is ensured which extends from the discharge opening 211 to a gap between the blocking wall 22 and the bottom wall 21. The improvement of the discharge capacity can be also enabled in this point. In this manner, the liquid discharge structure 20 can improve the discharge capacity for liquid collected within the casing 2 while suppressing liquid entering the discharge opening 211 from the outside.

Here, in the present embodiment, the rib wall 24 is formed on the outer surface of the bottom wall 21 so as to surround the discharge opening 211. According to this configuration, attachment and detachment of the blocking wall 22 is performed at the bottom wall 21, wherein a region in the vicinity of the discharge opening 211 is reinforced by the rib wall 24, the region being expected to be subject to an external force which may accompany the attachment and/or the detachment. This can improve the durability against such an external force.

Of the rib wall 24 according to the present embodiment, the outer enclosure wall 241 is provided with the recess 243 which is configured to pass liquid therethrough, the liquid exiting the discharge opening 211 on the outer surface side of the bottom wall 21. With this configuration, a flow of the liquid is not prevented by the rib wall 24 as described above, which can ensure a constant discharge capacity while enabling reinforcement by the rib wall 24.

Further, according to the present embodiment, the fixing mechanism 23 includes the rail sections 231, the stopper sections 232, the engaged section 233, and the engaging section 234. This configuration allows the blocking wall 22 to be fixed on the bottom wall 21 by a simple operation, i.e., by sliding the blocking wall 22 along the outer surface of the bottom wall 21 with the rail sections 231, which can increase an operability in assembling the liquid discharge structure 20 at the casing 2. Furthermore, gaps are created in several places due to supporting the blocking wall 22 in a slidingly attachable and detachable manner and/or due to engaging the engaging section 234 with engaged section 233 by sliding and thereby locking them, wherein the gaps function as discharge paths for liquid exiting the discharge opening 211, which can further improve the discharge capacity.

Moreover, according to the present embodiment, the engaging section 234 is configured with the cantilever 234a having the free end which is provided with the engaging claw 234b. This configuration allows the engaging claw 234b to be engaged with and locked in the engaged section 233 smoothly by utilizing deflection of the cantilever 234a, so that the operability in assembling can be further improved. In addition, gaps and/or spaces are created in several places in order to allow the cantilever 234a to be deflected, so that the gaps and/or spaces function as discharge paths for liquid as well, which can further improve the discharge capacity.

Further, according to the present embodiment, the rail sections 231 extend in the front-rear direction D21 of the vehicle, and are configured to support the blocking wall 22 in a slidable manner in the front-rear direction D21 as the sliding direction D22. This configuration allows liquid exiting the discharge opening 211 to be discharged along the above-described rail sections 231 towards both of the front and rear sides of the vehicle, which can further improve the discharge capacity.

Moreover, according to the present embodiment, the bottom wall 21, the rail sections 231, the bottom wall stopper section 232a and the engaged section 233 are integrally moulded from resin as the first moulded component. Further, the blocking wall 22, the blocking wall stopper sections 232b and the engaging section 234 are integrally moulded from resin as the second moulded component which is separate from the first moulded component. With this configuration, the above-mentioned elements are integrally moulded from resin for each of the bottom wall 21 and the blocking wall 22 in order to obtain totally two components for the bottom wall 21 and the blocking wall 22, which can reduce the number of components for the casing 2 and thus the component costs.

Moreover, according to the present embodiment, the casing 2 is a casing for an electrical junction box or for a protector which protects a wire harness. With this configuration, the above-described liquid discharge structure 20 is applied to a casing for an electrical junction box or a protector which is oft disposed in a lower portion of a vehicle and thus subject to liquid intrusion from the outside. With such application, the effects and the capacities of this liquid discharge structure 20 can be utilized effectively.

It is to be noted that the embodiments as described above merely show representative configurations for the liquid discharge structure, and the liquid discharge structure is not limited thereto, wherein various modifications may be carried out for implementation.

For example, the first and second embodiments as described above schematically show the casing 1, 2 and omit description e.g. of its detailed shape. However, any concrete shape of the casing 1, 2 may be used which includes a bottom wall having a plate shape with a discharge opening for liquid.

Further, the first and second embodiments as described above show the rib wall 14, 24 by way of example which is provided on one of the inner and outer surface of the bottom wall 11, 21 so as to surround the discharge opening 111, 211 at least partially. However, both of the inner and outer surfaces of the bottom wall 11, 21 may be flat without such a rib wall. However, as described above, the rib wall 14, 24 can further increase the durability against external forces onto the bottom wall 11, 21.

Moreover, the first and second embodiments as described above show the rib wall 14, 24 by way of example which surrounds the discharge opening 111, 211 and has a recess 142, 243, the recess 142, 243 allowing liquid to pass therethrough. However, such a recess may not be provided in the rib wall, and it may be configured so that liquid can pass across an upper end edge of the rib wall inside and outside the casing. However, as described above, the recess 142, 243 in the rib wall 14, 24 can ensure a constant discharge capacity.

Further, the first embodiment as described above shows the fixing mechanism 13 by way of example which includes the hinge section 131, the engaged holes 132 and the engaging sections 133. Additionally, the second embodiment shows the fixing mechanism 23 by way of example which includes the rail sections 231, the stopper sections 232, the engaged section 233 and the engaging section 234. However, the fixing mechanism may have any concrete mechanism configuration which is disposed so as not to be overlapped with the discharge opening in a plan view and configured to be fix the blocking wall relative to the bottom wall in an attachable and detachable manner. However, as described above, the fixing mechanism 13, 23 can further improve the operability in assembling the liquid discharge structure 10, 20 at the casing 2.

Moreover, the first embodiment shows the through-holes 122 by way of example which are provided in the blocking wall 12 so that the engaging claws 133b are visible. However, such through-holes may not be provided, and it may be configured so that the blocking wall includes an engaging section with an engaging claw projecting from a tip portion of the engaging section, wherein the engaging section is arranged vertically on the blocking wall. However, as described above as well, the through-holes 122 in the blocking wall 12 can enable a projection shape of the engaging claws 133b to be easily shaped without a slide mould and/or further increase the discharge capacity.

Further, the first embodiment shows two engaged holes 132 by way of example which are provided in the bottom wall 11 so as to be arranged in a direction along the rotation axis 13a with the discharge opening 111 interposed between the engaged holes 132, wherein two engaging sections 133 are arranged vertically on the blocking wall 12 for these two engaged holes 132. However, the engaged holes and the engaging sections are not limited in their concrete number and/or positions, which may be selected as appropriate. However, by providing two engaged holes 132 and two engaging sections 133, the discharge capacity for liquid and the fixing strength for the blocking wall 12 can be further improved, as described above as well.

Furthermore, the first embodiment as described above shows by way of example that the bottom wall 11, the blocking wall 12 and the fixing mechanism 13 are integrally moulded from resin, wherein the hinge section 131 of the fixing mechanism 13 has a smaller thickness than the blocking wall 12 and the bottom wall 11 and is therefore bendable. However, these portions may be formed separately from each other and combined e.g. by means of adhesive. Likewise, the hinge section is not limited to thin configuration with resin, but may be also e.g. a separate hinge element. However, as described above, integrally moulding including the hinge section can further reduce the component costs.

Additionally, the second embodiment as described above shows the engaging section 234 in the blocking wall 22 by way of example, the engaging section 234 including the cantilever 234a with the free end, wherein the engaging claw 234b is provided at the free end. However, the engaging section in the blocking wall is not limited thereto, and any concrete structure for engagement may be used which enables the blocking wall to be engaged with and locked in the engaged section in the bottom wall when attaching the blocking wall by sliding. However, as described above, the engaging section 234 which utilizes the deflection of the cantilever 234a can further improve the operability in assembling.

Further, the second embodiment as described above shows by way of example that the rail sections 231 in the bottom wall 21 are configured to support the blocking wall 22 in a slidable manner in the front-rear direction D21 of the vehicle as the sliding direction D22. However, the sliding direction for supporting the blocking wall by the rail sections is not limited thereto, and the sliding direction may be e.g. the width direction of the vehicle. However, by supporting the blocking wall 22 in a slidable manner in the front-rear direction D21 as the sliding direction D22, it is possible to discharge liquid along the rail sections 231 towards both of the front and rear of the vehicle, which can further increase the discharge capacity, as described above as well.

Furthermore, the second embodiment as described above shows by way of example that the bottom wall 21, the rail sections 231, the bottom wall stopper section 232a and the engaged section 233 are integrally moulded, while the blocking wall 22 and the engaging section 234 are integrally moulded. However, these portions may be formed separately from each other and combined e.g. by means of adhesive. However, as described above, the integrally moulding can further reduce the component costs.

Moreover, the first and second embodiments as described above show by way of example that the casing 1, 2 is a casing for an electrical junction box or a protector for protecting a wire harness. However, the casing may be configured for any concrete element as far as it is to be installed in a vehicle. However, by applying the liquid discharge structure 10, 20 to an electrical junction box and/or a protector which is subject to liquid intrusion from the outside, it is possible to effectively utilize the effects and capacities of the liquid discharge structure 10, 20, as described above.

REFERENCE SIGNS LIST 1, 2 Casing
1a, 241a Lateral walls
10, 20 Liquid discharge structure
11, 21 Bottom wall
12, 22 Blocking wall
13, 23 Fixing mechanism
13a Rotation axis
14, 24 Rib wall
111, 211 Discharge opening
112 Lateral sides
113 Extended protrusion
121 Lateral edges
122 Through-holes
131 Hinge section
132 Engaged holes
133 Engaging section
133a Main body section
133b Engaging claws
141 Wall section
142, 243 Recess
221 Supported structure
221a C-shaped plate
221a-1 Lateral edge portion
221b Vertical walls
231 Rail sections
232 Stopper sections
232a Bottom wall stopper section
232b Blocking wall stopper sections
233 Engaged section
233a, 234c Triangular ribs
234 Engaging section
234a Cantilever
234b Engaging claw
241 Outer enclosure wall
242 Inner enclosure wall
d11, d21, d22 Gap
D11, D21 Front-rear direction
D12, D23 Width direction
D22 Sliding direction P21 Blocking position
S11 First state
S12 Second state

What is claimed is:

1. A liquid discharge structure comprising:
a plate-shaped bottom wall with a discharge opening for liquid, the liquid being collected inside a casing which is configured to be installed in a vehicle;
a blocking wall outside the bottom wall, wherein the blocking wall is overlapped with the discharge opening in a plan view on the bottom wall and opposed to the bottom wall with a gap between the blocking wall and the bottom wall; and
a fixing mechanism which is disposed not to be overlapped with the discharge opening in the plan view, wherein the fixing mechanism is configured to fix the blocking wall relative to the bottom wall in an attachable and detachable manner,
wherein the fixing mechanism comprises:
a hinge section configured to couple the blocking wall to the bottom wall so as to allow the blocking wall to be rotated between a first state and a second state, wherein in the first state, the blocking wall is opposed to the bottom wall, and in the second state, the blocking wall is separated away from the bottom wall around a predetermined rotation axis;
an engaged hole in the bottom wall; and
an engaging section arranged vertically on the blocking wall so that in the first state, a tip portion of the engaging section enters the engaged hole in the bottom wall, wherein an engaging claw projects from the tip portion, the engaging claw being configured to be engaged with and locked to an edge of the engaged hole.

2. The liquid discharge structure according to claim 1, comprising:
a rib wall which is provided on one of an inner surface or an outer surface of the bottom wall so as to surround the discharge opening at least partially.

3. The liquid discharge structure according to claim 2, comprising:
a recess in the rib wall which is configured to allow liquid to pass therethrough, the liquid flowing on a side of the inner surface of the bottom wall towards the discharge opening or exiting the discharge opening on a side of the outer surface of the bottom wall.

4. The liquid discharge structure according to claim 1, comprising:
a through-hole which is provided in the blocking wall adjacent to a root of the engaging section so that the engaging claw is visible when viewing the blocking wall from an opposite side to the engaging section.

5. The liquid discharge structure according to claim 1, wherein two engaged holes are provided in the bottom wall so as to be arranged in a direction extending along the rotation axis with the discharge opening interposed between the engaged holes, and
wherein two engaging sections are arranged vertically on the blocking wall for the two engaged holes.

6. The liquid discharge structure according to claim 1, wherein the bottom wall, the blocking wall and the fixing mechanism are integrally moulded from resin, and
wherein the hinge section is a bendable section with a smaller thickness than the blocking wall and the bottom wall.

7. The liquid discharge structure according to claim 1, wherein the casing is a casing for an electrical junction box to be installed in the vehicle.

8. A liquid discharge structure comprising:
a plate-shaped bottom wall with a discharge opening for liquid, the liquid being collected inside a casing which is configured to be installed in a vehicle;
a blocking wall outside the bottom wall, wherein the blocking wall is overlapped with the discharge opening in a plan view on the bottom wall and opposed to the bottom wall with a gap between the blocking wall and the bottom wall; and
a fixing mechanism which is disposed not to be overlapped with the discharge opening in the plan view, wherein the fixing mechanism is configured to fix the blocking wall relative to the bottom wall in an attachable and detachable manner,
wherein the fixing mechanism comprises:
a rail section at the bottom wall, wherein the rail section is configured to support the blocking wall in a slidingly attachable and detachable manner in a predetermined sliding direction along an outer surface of the bottom wall;
a stopper section at at least one of the bottom wall or the blocking wall, wherein the stopper section is configured to limit sliding the blocking wall so as not to slide beyond a blocking position at which the blocking wall is overlapped with the discharge opening;
an engaged section at the outer surface of the bottom wall; and
an engaging section at the blocking wall, wherein the engaging section is configured to be engaged with and locked to the engaged section with the stopper section being limiting sliding.

9. The liquid discharge structure according to claim 8, wherein the engaging section is configured with a cantilever extending in the sliding direction, the engaging section having one end as a fixed end and another end as a free end, wherein an engaging claw is provided at the free end,
wherein when the blocking wall is slid to the blocking position, the engaging claw is configured to pass across the engaged section by utilizing deflection of the cantilever, and the engaging claw is engaged with and locked to the engaged section when the blocking wall reaches the blocking position.

10. The liquid discharge structure according to claim 8, wherein the rail section is configured to be disposed extending in a front-rear direction of a vehicle and to support the blocking wall in a slidable manner in the front-rear direction as the sliding direction.

11. The liquid discharge structure according to claim 8, wherein the bottom wall, the rail section, the stopper section in case of being provided in the bottom wall, and the engaged section are integrally moulded from resin as a first moulded component, and
wherein the blocking wall, the stopper section in case of being provided in the blocking wall, and the engaging section are integrally moulded from resin as a second moulded component which is separate from the first moulded component.

* * * * *